(12) United States Patent
Rzyski et al.

(10) Patent No.: US 7,693,674 B2
(45) Date of Patent: Apr. 6, 2010

(54) LOW-NOISE SOURCE

(75) Inventors: Eugene Rzyski, Irvine, CA (US); Todd Wangsness, Murrieta, CA (US)

(73) Assignee: OmniPhase Research Laboratories, Inc., Newport Beach, CA (US)

( * ) Notice: Subject to any disclaimer, the term of this patent is extended or adjusted under 35 U.S.C. 154(b) by 368 days.

(21) Appl. No.: 11/494,884

(22) Filed: Jul. 28, 2006

(65) Prior Publication Data

US 2007/0032976 A1 Feb. 8, 2007

Related U.S. Application Data

(63) Continuation-in-part of application No. 11/134,546, filed on May 20, 2006.

(51) Int. Cl.
*G01R 35/00* (2006.01)

(52) U.S. Cl. .......................................... 702/111; 700/44

(58) Field of Classification Search .................. 702/111, 702/182–185, 188; 700/1, 44
See application file for complete search history.

(56) References Cited

U.S. PATENT DOCUMENTS

| | | | |
|---|---|---|---|
| 6,169,638 B1 * | 1/2001 | Morling | ....................... 360/46 |
| 6,393,372 B1 | 5/2002 | Rzyski | |
| 6,496,064 B2 | 12/2002 | Rzyski | |

FOREIGN PATENT DOCUMENTS

WO WO2006/127432 11/2006

* cited by examiner

*Primary Examiner*—Edward Raymond (57) ABSTRACT

In one embodiment, a low-noise source includes: a signal source; a variable amplifier adapted to amplify an output signal from the signal source to provide an amplified signal; a feed-forward amplifier adapted to amplify the amplified signal to provide an amplified output signal; a phase noise measurement system adapted to provide a first feedback signal responsive to phase noise in the amplified output signal; and a processor adapted to control the amplification provided by the variable amplifier responsive to the feedback signal so as to minimize phase noise in the amplified output signal.

8 Claims, 7 Drawing Sheets

LOW-NOISE SOURCE

CROSS REFERENCE TO RELATED APPLICATION

This application is a Continuation-In-Part of U.S. patent application Ser. No. 11/134,546, filed May 20, 2006, the contents of which is incorporated by reference in its entirety.

FIELD OF INVENTION

This invention relates to signal sources and more particularly to a low-noise source.

BACKGROUND

Noise in electrical systems and other types of systems such as electro-optic and electro-acoustic systems may disrupt both the amplitude and phase of signals. However, because many systems are relatively insensitive to fluctuations in amplitude, the fluctuations in phase (denoted as phase noise) are generally more problematic. For example, an oscillator may be designed to output a sinusoid at a desired frequency. Oscillators typically include some type of amplitude-limiting feature so that only phase noise will be a major noise contributor to the output sinusoid.

Because phase noise is such an important factor of overall noise, designers often desire a measure of the phase noise for a given system. Various approaches have been used to characterize phase noise. For example, amplifiers have been characterized by inputting a signal of known frequency into the amplifier and measuring a resulting amplified output in a spectrum analyzer. But the sensitivity of such an approach is limited by the relatively-poor sensitivity of the spectrum analyzer. Moreover, it is difficult to measure phase noise at frequencies close to the carrier frequency.

Figure 1:
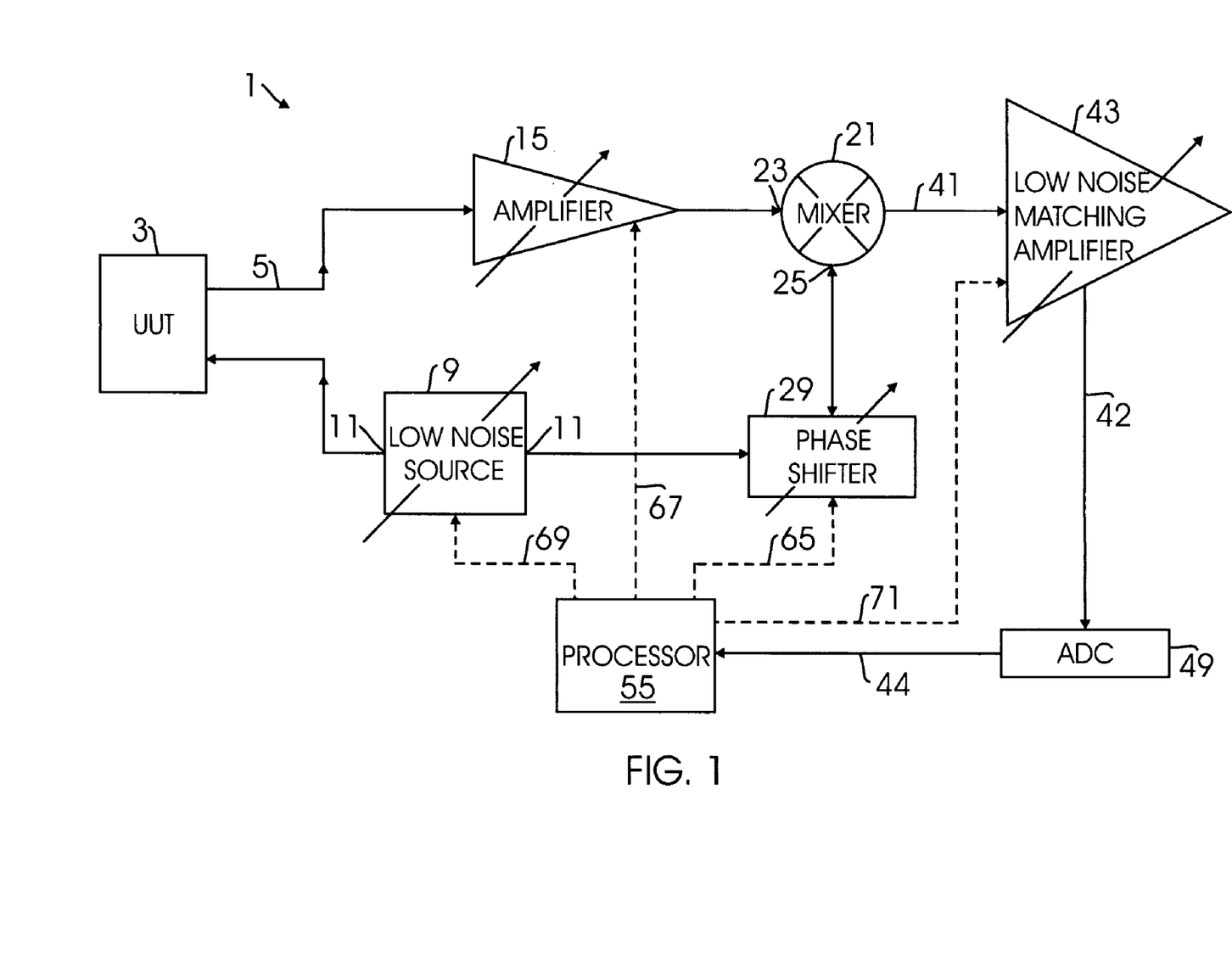
FIG. 1 is a block diagram of an automated phase noise test measurement system.

Unlike a spectrum analyzer, a phase-locked discriminator system has relatively good sensitivity and allows measurements close to the carrier frequency. However, the configuration of a phase-locked discriminator system is cumbersome and time consuming. Thus, an automated phase-locked discriminator noise test measurement system has been developed as described in U.S. Pat. No. 6,393,372 that alleviates the cumbersome nature of such systems. FIG. 1 illustrates an embodiment of such an automated system 1. A low-noise source 9 provides an input signal 11 for driving a unit-under-test (UUT) 3. UUT 3 may be any device for which a user desires a phase noise test measurement such as an amplifier, phase-shifter, diplexer or other suitable device or system of devices. UUT 3 receives the input from source 9 and processes it to provide an output signal 5. For example, if UUT 3 is an amplifier, output signal 5 would be an amplified version of input signal 11. Output signal 5 is amplified by variable amplifier 15 to provide an input signal 23 to a mixer 21. Source 9 also provides a version of input signal 11 to a variable phase-shifter 29. Variable phase-shifter 29 shifts input signal 11 by 90 degrees to provide a phase-shifted signal 25 to another input port of mixer 21. In this fashion, the "carrier" signal (input signal 11) is eliminated from a mixer output signal 41. To keep output signal 41 in the proper dynamic range of an analog-to-digital converter (ADC) 49, mixer output signal 41 is processed by a low-noise matching amplifier 43 to provide an output signal 42 to ADC 49.

To eliminate the carrier signal, the phase-shifted signal 25 must be in quadrature (shifted 90 degrees) with respect to the carrier. If quadrature is not established, a DC offset will be present in a digital output 44 from ADC 49. A controller such as a processor 55 monitors digital output 44 and controls phase-shifter 29 using a control signal 65 to maintain quadrature. The elimination of the carrier signal from low-noise source 9 also depends upon whether the carrier (input signal 11) and the phase-shifted version of the carrier (signal 25) are of equal power when entering mixer 21. Thus, analogous to the control of phase-shifter 29, processor 55 also controls variable amplifier 15 responsive to processing digital signal 44 using a control signal 67 to maintain equal powers for signals 25 and 23. These powers need not be maintained exactly equal but instead may merely be within a sufficient range of each other so that linear operation of mixer 21 is assured. Those of ordinary skill in the art will appreciate that variable amplifier 15 does not just amplify but may also attenuate responsive to control signal 67. For example, if UUT 3 is an amplifier, variable amplifier 15 will have to attenuate output signal 5 to keep signals 23 and 25 in comparative power equality. Processor 55 may also control low-noise matched amplifier 43 using a control signal 71 to maintain signal 42 in the proper dynamic range for ADC 49.

Having controlled the components for quadrature operation as just discussed, processor 55 assures that the carrier signal is eliminated from digital output 44 such that digital output signal 44 simply represents the phase noise. The phase noise injected by low-noise source 9 may be accounted for by a calibrating operation in which UUT 3 is removed and source 9 simply feeds amplifier 15 directly, although such a direct feed may occur through a delay line (not illustrated). The resulting phase noise in digital signal 44 during calibration may be stored in a memory associated with processor 55. Thus, during testing of UUT 3, processor 55 (or a spectrum analyzer associated with processor 55) may perform a Fourier analysis of digital signal 44 to determine the phase noise power produced by low-noise source 9. The measured phase noise may then be adjusted by the phase noise injected by source 9 to determine the additive phase noise supplied by UUT 3.

The phase noise measured in digital signal 44 depends upon the frequency of input signal 11 provided by source 9. For example, UUT 3 may be quite noisy at one frequency but less so at another. To measure phase noise across a range of frequencies, processor 55 may command source 9 to change the frequency of input signal 11 using a command signal 69, measure the resulting phase noise, change the frequency again, measure the resulting phase noise, and so on. Advantageously, such measurement is performed automatically and accurately with no manual intervention or tuning as would be necessary in conventional phase noise test measurement systems.

Although a phase-locked discriminator system 1 represents a dramatic advance in the art, certain challenges remain. For example, many factors are involved in properly biasing or driving a given component for optimum low-noise performance. To intelligently control these factors, U.S. patent application Ser. No. 11/134,546, filed May 20, 2005, the contents of which are incorporated by reference herein, discloses a system that includes a phase-locked discriminator system such that a component or system of components may be biased appropriately to achieve optimum low-noise performance. In one embodiment, this system may be used to bias an oscillator signal source. In that regard, it will be appreciated that the illustrated separation between UUT 3 and low-noise source 9 of FIG. 1 is merely a conceptual separation should UUT be a source UUT such as an oscillator. In such a case, the source is the UUT. It would thus be redundant to drive a source UUT such as an oscillator with a source—there is no need for an external carrier signal source for a source UUT.

Figure 2:
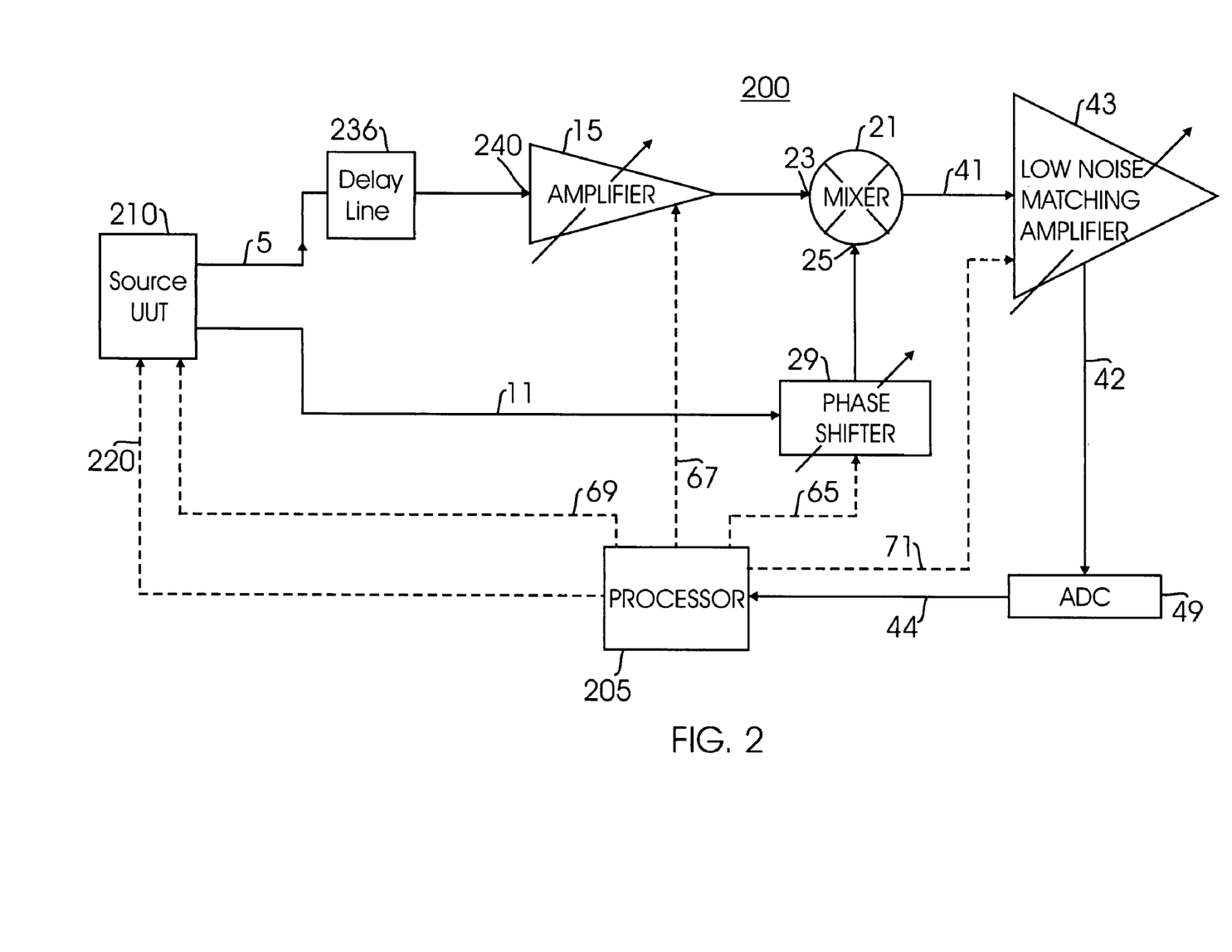
FIG. 2 is a block diagram of an intelligent biasing system.

Turning now to FIG. 2, an intelligent biasing system 200 for a source UUT 210 is illustrated. To analyze the phase noise of a source UUT 210, a delay line 236 forms a delayed version 240 of output signal 5 from source UUT 210. Note that in case of a perfect source that provides a sinusoidal output signal $\cos(\omega t)$, the phase difference between arbitrary times $t_1$ and $t_2$ depends solely upon the delay period between these times. However, in a real world source, there will also be some phase noise that affects this phase difference. In general, it can be shown that the selection of the delay period affects the ability of a phase noise test measurement system to measure phase noise at smaller frequency offsets to the carrier signal frequency as well as the sensitivity of the phase noise measurement. As the delay provided by delay line 236 is increased, the ability to measure phase noise at smaller offsets from the carrier frequency is enhanced as well as the sensitivity. However, delay cannot be arbitrarily increased because attenuation through the delay line may become too severe and affect the measurement. Comparing FIGS. 1 and 2, it may be seen that the control and operation of the variable amplifier 15, mixer 21, low-noise matching amplifier 43, ADC 49, and phase-shifter 29 is the same. Thus, source UUT 210 provides a version of input signal 11 to phase shifter 29 analogously as discussed with respect to low-noise source 9 of FIG. 1. Variable amplifier 15 provides output signal 23 to mixer 21, which mixes this signal with a phase-shifted version 25 of carrier signal 11.

A controller such as a processor 205 controls amplifier 15 with control signal 67 to maintain linear operation of mixer 21. Processor 205 also operates to tune controllable variable(s) within source UUT 210 using a command signal 220. For example, a conventional source designer has no real way to bias components such as transistors for the best phase noise performance. In general, the conventional designer may simply guess that a certain bias point is best for low-noise operation. However, system 200 can intelligently set a controllable variable such as, for example, the bias voltage for a transistor by finding the bias voltage that results in the lowest phase-noise performance. Similarly, processor 205 controls the carrier frequency used by source UUT 210 using control signal 69 analogously as discussed with respect to low-noise source 9 of FIG. 1. The "best fit" method or any signal processing method capable of "best data fit" determination may be used to determine an optimum setting for the controllable variables. The control of a control variable (CV) such control signals 67, 69, 65, and 220 with regard to their effect on a measured variable (MV) such as phase noise is discussed further herein. In general, the controllable variables for the source UUT are set such that they result in an optimum additive phase noise performance.

Although the intelligent biasing system disclosed in U.S. application Ser. No. 11/134,546 gives a designer the ability to bias or tune controllable variables within a source UUT so as to result in optimum additive phase noise performance, it does not provide the underlying low-noise source configuration. In other words, given an existing source, it may be tuned using the intelligent biasing system, but one must first design the source. In general, ultra low-noise sources are very expensive, typically costing as much as $150,000 or more. Although such expensive sources may be advantageously tuned using an intelligent biasing system, such tuning only adds to their already prohibitive costs.

Accordingly, there is a need in the art for a low-noise yet low-cost source.

SUMMARY

In accordance with a first aspect of the invention, a system is provided that includes: a signal source; a variable amplifier adapted to amplify an output signal from the signal source to provide an amplified signal; a feed-forward amplifier adapted to amplify the amplified signal to provide an amplified output signal; a phase noise measurement system adapted to provide a first feedback signal responsive to phase noise in the amplified output signal; and a processor adapted to control the amplification provided by the variable amplifier responsive to the feedback signal so as to minimize phase noise in the amplified output signal.

In accordance with another aspect of the invention, a method of minimizing a phase noise in an output signal from a feed-forward amplifier is provided. The feed-forward amplifier receives an input signal from a variable amplifier driven by a signal source. The method includes the acts of: measuring the phase noise; and adjusting the variable amplifier to minimize the measured phase noise.

The invention will be more fully understood upon consideration of the following detailed description, taken together with the accompanying drawings.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 3:
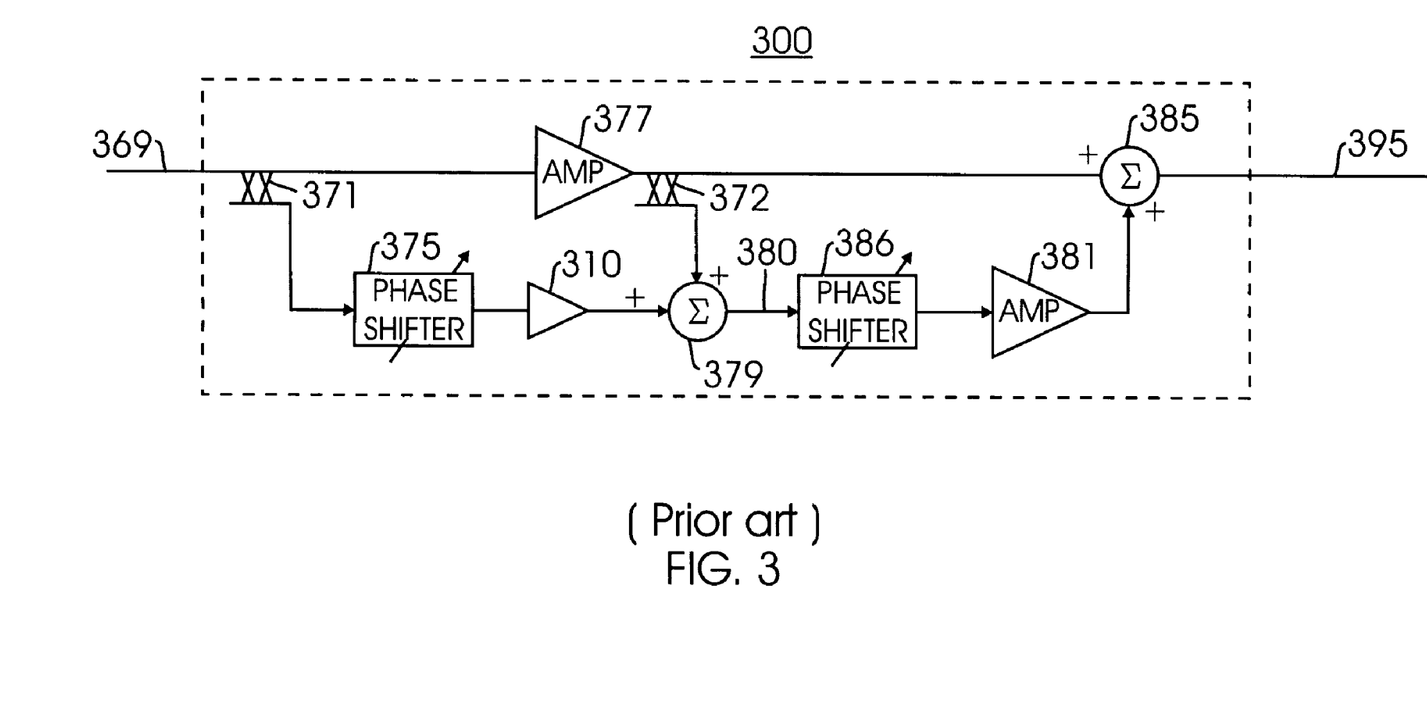
FIG. 3 is a block diagram of a conventional feed-forward amplifier.

To provide a low-noise source, a reference source is received by a feedforward amplifier such as disclosed in U.S. Pat. No. 6,496,064, the contents of which are incorporated by reference. Such feedforward amplifiers are better understood with reference to a conventional feedforward amplifier 300 as illustrated in FIG. 3. The "feedforward" aspect of amplifier 300 is used to cancel noise such as intermodulation (IM) products introduced into an input signal 369 by amplification through a main amplifier 377. A coupler 371 provides a version of the input signal to a phase shifter 375 that drives an amplifier 310. In turn, the amplifier provides an amplified and phase-shifted output signal to an adder 379. Adder 379 also receives a version of an output signal from main amplifier 377 through another coupler 372. If phase-shifter 375 and amplifier 310 are controlled such that the output from amplifier 310 is the same amplitude but 180 degrees out of phase with the output from main amplifier 377, an output signal 380 from adder 379 represents a version of the additive noise introduced by main amplifier 377. The additive noise may then be cancelled by processing through a phase shifter 386 and an amplifier 381 such that an output signal from amplifier 381 is the same amplitude but 180 degrees out of phase with the additive noise in the output signal from main amplifier 377. This additive noise may thus be cancelled through an addition in adder 385 to provide a relatively noiseless output signal 395. It may be seen that feedforward amplifier 300 uses the feedforward aspect to obtain a version of the additive noise introduced by main amplifier 377. This version is then phase-shifted and amplified so that it cancels the additive noise introduced by main amplifier 377.

Figure 4:
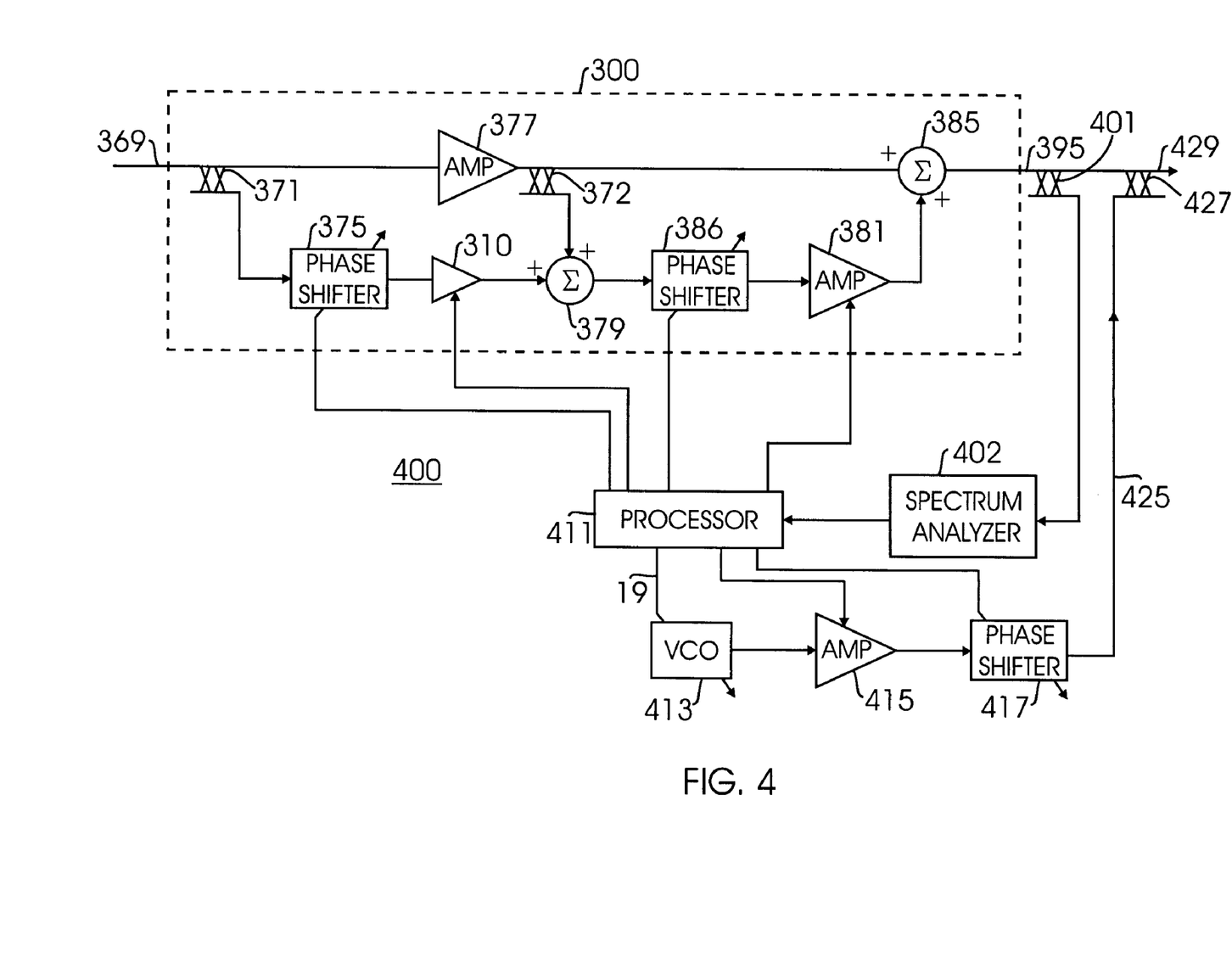
FIG. 4 is a block diagram of a low-noise feed-forward amplifier.

Although feedforward amplifiers advantageously reduce noise in this fashion, the feedforward mechanism itself introduces noise into the output signal. To address this additional noise, U.S. Pat. No. 6,496,064 discloses a modified feedforward amplifier. An exemplary feed-forward amplifier 400 is illustrated in FIG. 4. Feed-forward amplifier 300 operates as discussed with regard to FIG. 3. However, a coupler 401 provides a version of output signal 395 to a spectrum analyzer 402. Spectrum analyzer 402 determines the power of various components in output signal 395, including the power of undesirable IM products. A controller such as processor 411 has the frequency of the output signal in memory and thus can recognize whether a component reported by the spectrum analyzer is an undesirable IM product. It will be appreciated that the "spectrum analyzer" is illustrated conceptually in that the output from coupler 401 may be digitized and directly analyzed in the processor to determine its spectrum. The processor notes the frequency of the undesirable IM products in the spectrum and commands a VCO 413 to provide a sinusoid at the frequency for a selected IM product. The sinusoid is then processed through a phase-shifter 417 and an amplifier 415 to provide a phase-shifted and amplified signal 425. The processor controls phase-shifter 417 and amplifier 415 such that signal 425 is of the same amplitude but 180 degrees out of phase with the IM product (or other undesirable signal component) in output signal 395. Thus, the IM product is cancelled through addition of signal 425 into an output signal 429 through a coupler 427. Processor 411 may also control the phase shifters 375 and 386 as well as amplifiers 310 and 381 such that the operation of feed-forward amplifier 300 proceeds as discussed with regard to FIG. 3.

Figure 5:
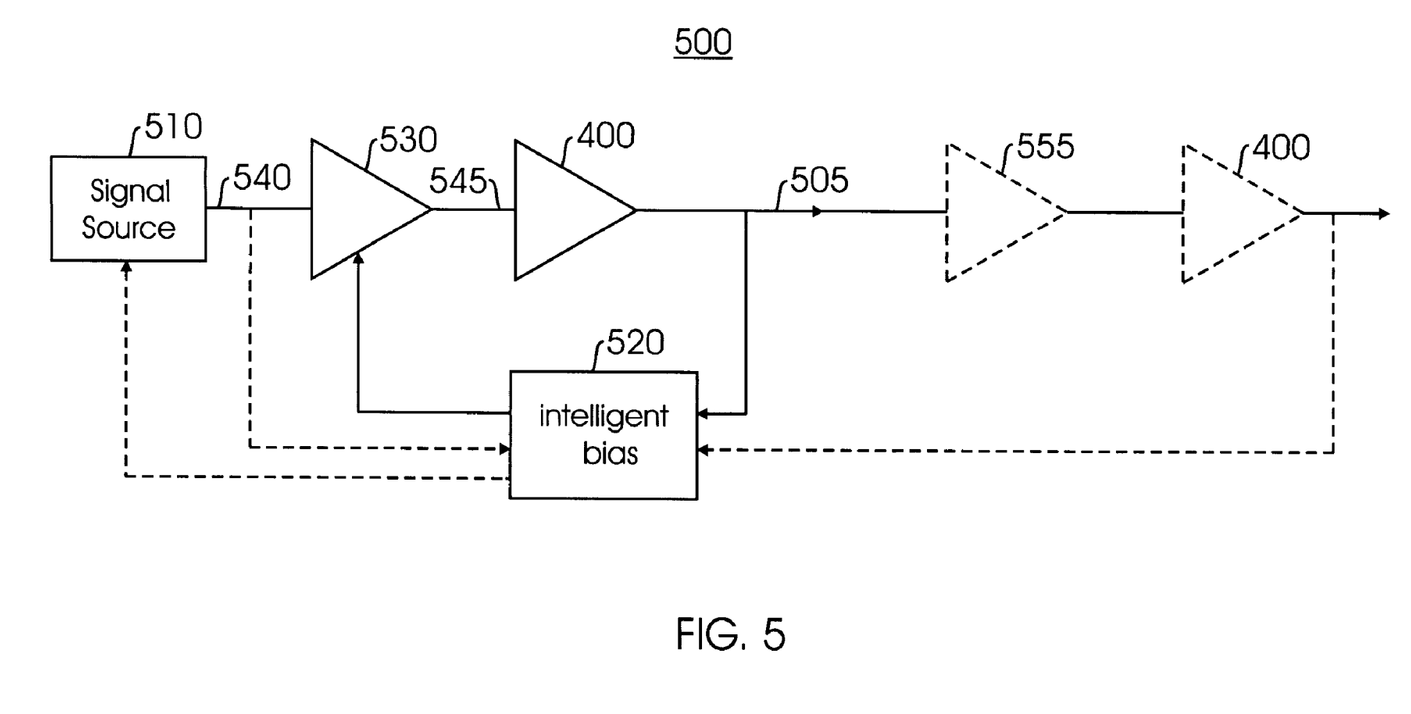
FIG. 5 is a block diagram of a low-noise source in accordance with an embodiment of the invention.

To provide a low-noise source, feed-forward amplifier 400 may be integrated into a system 500 as illustrated in FIG. 5. Feed-forward 400 amplifier operates as discussed with regard to FIG. 4. Thus, it includes a main amplifier associated with a feedforward path such that IM products introduced into an output signal 505 are cancelled. In addition, feed-forward amplifier 400 also includes the components discussed with regard to FIG. 4 that cancel the IM product(s) introduced by the feedforward path. Feed-forward amplifier 400 amplifies a signal provided by a signal source 510. However, to maintain optimum performance for feed-forward amplifier 400, phase noise in output signal 505 is monitored by an intelligent bias system 520 such as that discussed with regard to FIG. 2. Based upon the measured noise, system 520 controls a variable amplifier 530 to adjust an input signal power for feed-forward amplifier 400. In this fashion, feed-forward amplifier 400 operates in its "sweet spot" in which it achieves lowest additive phase noise performance. Referring back to FIG. 2, it can be seen that system 520 differs from system 200 in that the intelligent bias is directed to a variable amplifier rather than a source unit-under-test as shown in FIG. 2. Moreover, signal source 510 may or may not be stepped across a frequency band using a control signal 525 in that the noise performance is being optimized for whatever frequency signal source 510 is designed to provide. It will be appreciated that system 500 is shown conceptually in that, for example, both the intelligent bias system of FIG. 2 and the feed-forward amplifier 400 of FIG. 4 included a processor. Thus, a single processor (not illustrated) may function as the processor for all these components. Alternatively, the processing power may be spread across several processors. In addition, it will be further appreciated that phase noise may be measured through alternative means such as a direct downconversion receiver in lieu of the phase noise measurement system discussed with regard to FIG. 2.

An advantageous feature of system 500 is that the noise floor for output signal 505 is reduced with respect to that for an unprocessed output signal 540 provided by signal source 510 because spurs such as IM products are removed from output signal 505. Not only are these spur(s) removed through action of feed-forward amplifier 400 but they are also reduced through the intelligent biasing of an amplified input signal 545 provided by variable amplifier 530. Accordingly, it is believed that an extremely low-noise floor may be obtained—for example, on the order of 150 dB below the carrier. Moreover, such state-of-the-art noise floors are obtained using a relatively inexpensive implementation.

Figure 6:
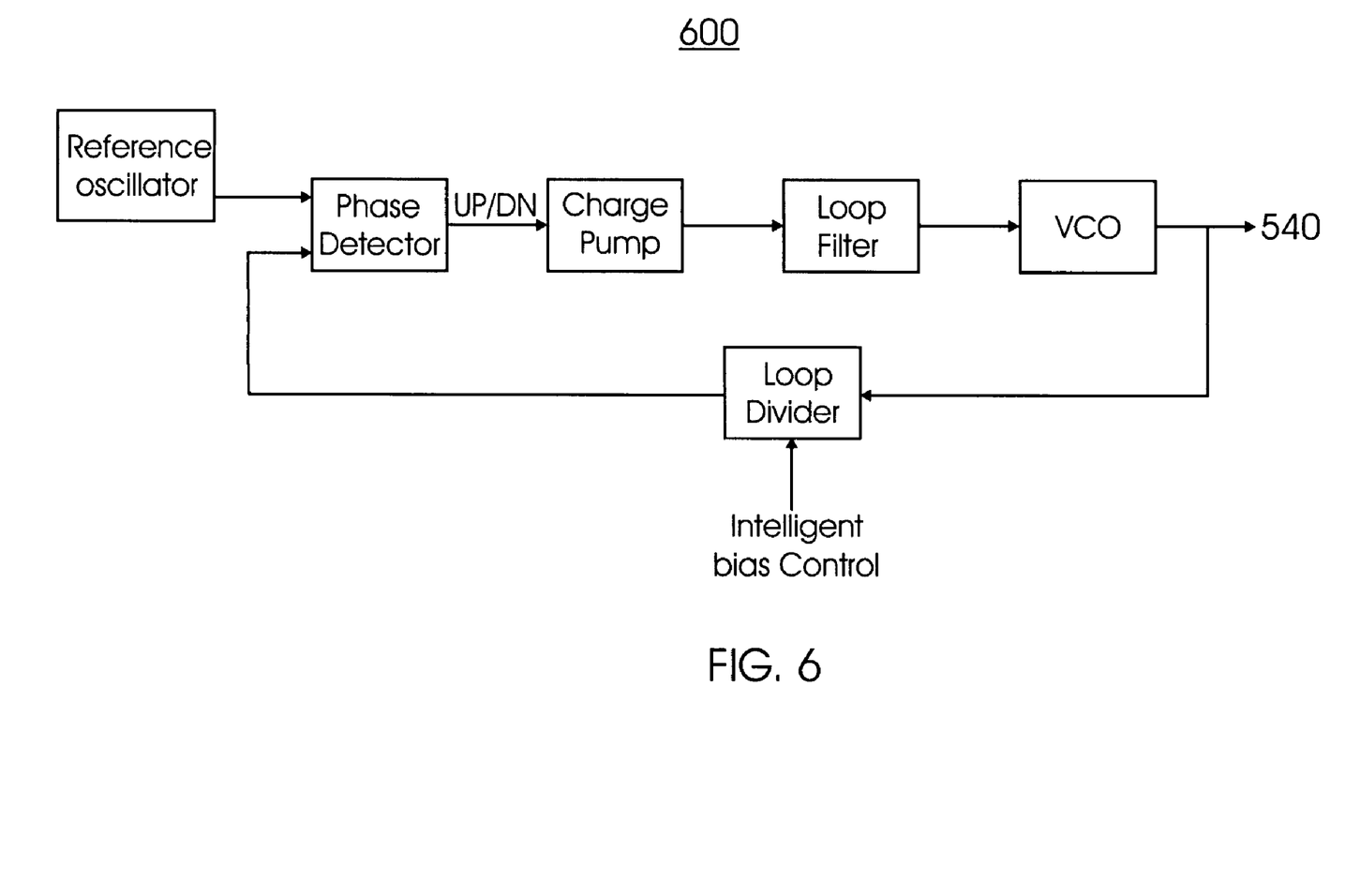
FIG. 6 is a block diagram of a phase-locked loop for the low-noise source of FIG. 5.

To obtain additional noise floor enhancement, the intelligent bias discussed with regard to the source unit-under-test of FIG. 2 may be applied to signal source 510. For example, as seen in FIG. 6, signal source 510 may be implemented using a phase-locked loop (PLL) 00. As known in the PLL arts, PLL 600 includes a loop divider that determines the frequency of output signal 540 with respect to an input signal's frequency as determine through operation of a reference oscillator. A phase detector compares a feedback signal from the loop divider to the output signal from the reference oscillator. Based upon this comparison, the phase detector drives a charge pump, which in turn drives a loop filter. A filtered output from the loop filter drives a VCO. In this fashion, output signal 540 is maintained at the desired multiple (as determined by the loop divider setting) of the reference oscillator's frequency. To enhance the noise performance of output signal 540, intelligent bias system 520 (of FIG. 5) may measure the phase noise in output signal 540 and control the loop divider using control signal 525 as shown in FIG. 6 such that an optimum frequency is found at which the phase noise is minimized.

Numerous modifications of system 500 may be implemented. For example, referring back to FIG. 5, additional stages of variable amplifier/feed-forward amplifier pairs may be included such that a preceding pair (such as variable amplifier 530 and feed-forward amplifier 400) drives a subsequent pair of a variable amplifier 555 and an additional feed-forward amplifier 400. The additive phase noise from this additional feed-forward amplifier may be minimized using intelligent bias of variable amplifier 555.

Each feed-forward amplifier 400 may be modified as discussed in U.S. Pat. No. 6,496,064 such that multiple VCO-variable amplifier-variable phase shifter combinations are used. Each combination is dedicated to the elimination of an IM product or other undesirable signal component at a given frequency. For example, a first VCO has its output phase-shifted and amplified so as to eliminate a spur at a frequency F1, a second VCO has its output phase-shifted and amplified so as to eliminate a spur at frequency F2, and so on. In this fashion, the noise floor for an output signal may be reduced even further.

Figure 7:
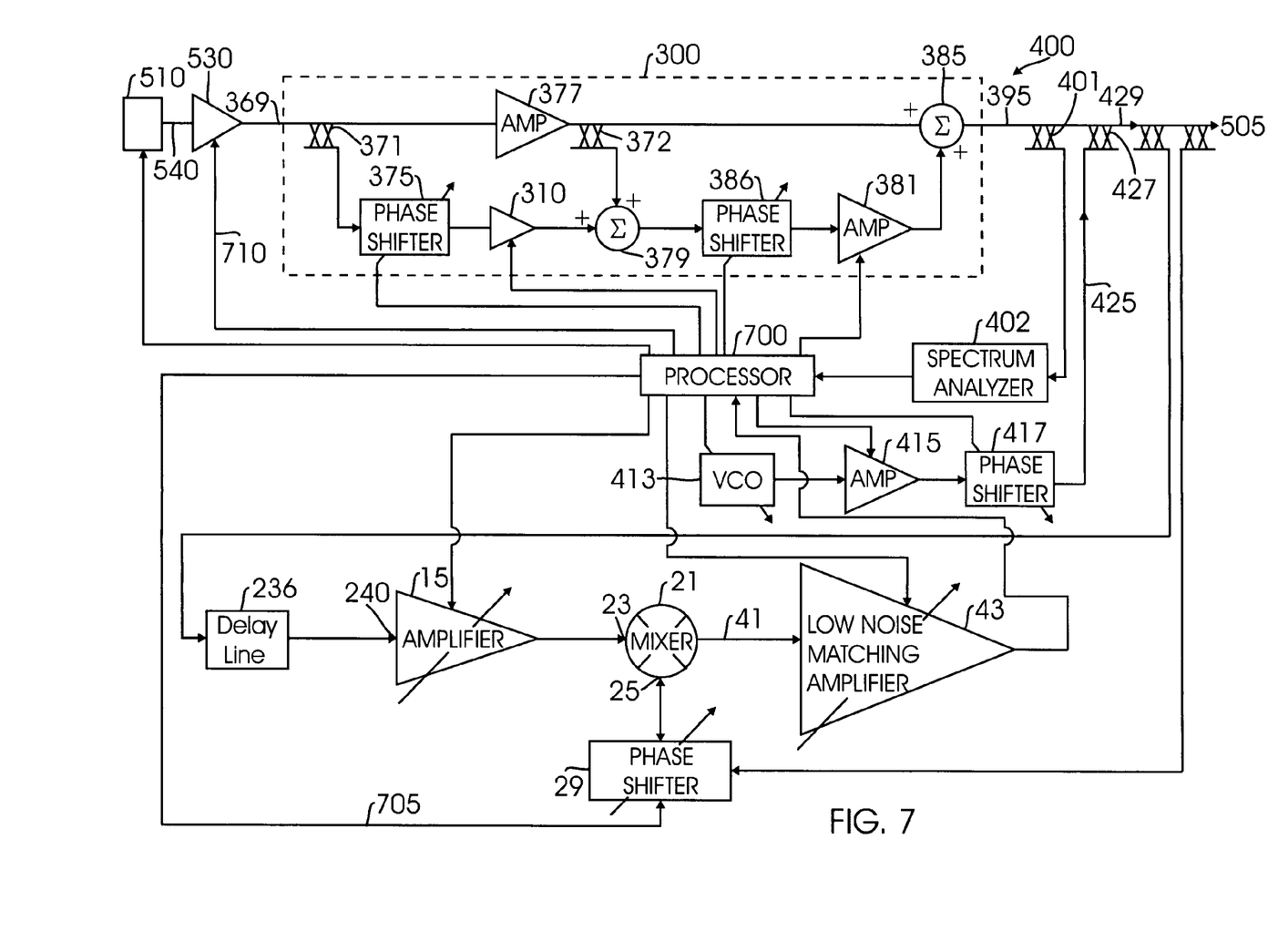
FIG. 7 is a more detailed block diagram of an embodiment of the system of FIG. 5.

An exemplary embodiment of system 500 is illustrated in FIG. 7. Feed-forward amplifier 400 is driven by a variable amplifier 530 and a signal source 510 as discussed with regard to FIG. 5. However, processor 411 of FIG. 4 has been replaced with controller such a processor 700 in that this processor controls the intelligent bias as well. Feed-forward amplifier 400 includes variable phase-shifter 375, variable amplifier 410, adder 379, variable-phase shifter 385, variable amplifier 381, main amplifier 377 and an adder 385 to form a feed-forward amplifier 300 as discussed earlier. IM products introduced into the output signal 395 by the feed-forward path are eliminated using VCO 413, variable amplifier 415 and variable phase-shifter 417 based upon the analysis by spectrum analyzer 402. As discussed previously, the spectrum analyzer is illustrated separately from the processor for conceptual purposes because the processor may itself be configured to perform the spectrum analysis, for example, by implementing a Fourier transform of the received signal.

To drive variable amplifier 530 so as to provide the optimum input power in input signal 369, a version of output signal 505 is received by a delay line 236, which drives a variable amplifier 15 to produce an input signal 23 for a mixer 21. A version of output signal 505 is phase-shifted through variable phase-shifter 29 to provide a quadrature version 25 of the carrier signal in input signal 23 to a mixer 21. The mixer output is received by a low-noise matching amplifier 43 and an analog-to-digital converter (ADC) (not illustrated) to provide a feedback signal to the processor. The processor controls variable phase-shifter 29 to maintain quadrature by measuring any DC offset in the feedback signal. In addition, the processor controls variable amplifier 15 to maintain linear mixer operation and also controls low-noise matching amplifier 43 to maintain proper ADC operation.

The processor may thus process the feedback signal to measure phase noise in the output signal 505. By controlling variable amplifier 530 to find a minimum measured phase noise, the processor may thus optimize the noise floor in output signal 505. In addition, the processor may control the source as discussed with regard to FIG. 6 to further reduce the noise floor. In such an embodiment, delay line 236 and variable phase-shifter 29 could include a switch at their inputs so as to alternatively measure the phase noise in output signal 505 and in unprocessed output signal 540 provided by signal source 510. Moreover, additional tuning of components in the source such as bias voltages may also be set using control from the processor based upon the measured phase noise in the feedback signal. In addition, a separate delay line/variable amplifier/mixer/variable phase-shifter combination could be used to measure the phase noise in unprocessed output signal 540.

It will be appreciated that what has been denoted above as a "processor" may be implemented using a microprocessor. Alternatively, a "hard-wired" controller such as an ASIC-implemented state machine that implements suitable control algorithms may be used to perform the processor control functions. In another embodiment, a configured programmable logic device such as an FPGA may be used to provide the desired control. Regardless of the hardware used, the control of the phase-shifters and other controllable variables may be performed using a number of control algorithms. The control signal to each variable component such as variable amplifier 530 and phase-shifter 29 may be denoted as a "control variable" (CV). Empirical observations may show that a single CV has a dominant effect. Thus, in such embodiments, the dominant CV may be tuned first, followed by the less dominant CVs. However, it will be appreciated that this tuning methodology may be readily extended to the control of multiple CVs in parallel. The tuning of a CV depends upon it effect upon a measured variable (MV). An exemplary MV is the "phase-noise" signal coming from low-noise amplifier 43. This signal is digitized in an analog-to-digital converter (not illustrated) before being processed by a controller such as processor 700. For example, the digitized signal may be analyzed using a Fast Fourier Transform (FFT) to reveal the phase-noise spectrum. To obtain the phase noise spectrum, phase-shifter 29 is controlled by a CV 705 to be in quadrature such that the carrier signal is eliminated through mixer 21. If, however, the carrier is not eliminated due to an error in CV 705, the carrier will be present as a DC offset in resulting phase-noise spectrum. This DC offset will change sign as the phase-shifter scans through quadrature (for example, from 80 to 100 degrees) such that it has one polarity on one side of the quadrature and an opposite polarity on the other side of quadrature. This change of sign may be used in a zero-crossing search. In general, a CV that produces a zero-crossing MV may have its range divided into a number of intervals. The controller steps the CV through these intervals and observes the effect on the zero-crossing MV. For example, the zero-crossing MV may change sign with regard to two values $MV_0$ and $MV_1$ corresponding to values for the CV of $CV_0$ and $CV_1$, respectively. Given this straddling of the zero-crossing point, it may be shown that an optimal setting for the CV ($CV_{opt}$) is:

$$CV_{opt} = (CV_0 * MV_1 - CV_1 * MV_0)/(MV_1 - MV_0) \qquad \text{Eq. (1)}$$

In general, the optimal value for a CV such as the control signal to phase-shifter 29 will change with time. This change in time may be tracked using a convergence algorithm. For example, the straddling interval (corresponding to $CV_1$ and $CV_0$) may be reduced by a convergence factor such as two. A new value for $CV_{opt}$ is then calculated using, for example, Equation (1). The difference between successive measurements may then be averaged with previously-obtained differences to provide a time-varying-corrective factor. A calculated $CV_{opt}$ may then be adjusted according to the time-varying-corrective factor. Prior to updating CV, a measurement of the MV with regard to a tolerance factor may be performed.

Other control variables (CVs) may produce a maximum or minimum in the corresponding measured variable (MV) in contrast to producing a zero-crossing. For example, variable amplifier 530 is controlled by a control variable 710 such that the measured phase noise from amplifier 43 is at a minimum. This minimum may be with regard to a certain frequency in the phase noise spectrum or with regard to an integration of the phase noise power across a certain bandwidth in the phase noise spectrum. To find a minimum, the CV may be incremented across its range such that for five successive increments of CV ranging from a value of $CV_0$ to $CV_4$, the corresponding values of MV are produced such that $MV_2 < MV_1 < MV_0$ and also $MV_2 < MV_3 < MV_4$. A corresponding relationship to find the maximum for an MV that is to be controlled to produce a maximum value would be $MV_2 > MV_1 > MV_0$ and also $MV_2 > MV_3 > MV_4$. The corresponding value of the CV that produces the minimal/maximum MV would thus be $CV_2$. If no minimum or maximum is found across the available range for the CV, the intervals between successive CV values may be too broad such that a new search is performed with the interval spacing reduced by ½. Once the minimum or maximum is found, the interval between $CV_0$ and $CV_4$ is sampled at twice the previous rate such that the interval between successive CV points is ½ what was used in the previous search. If the maximum or minimum pattern is no longer discernable, it may be presumed that the algorithm has zoomed into the noise at the peak (or minimum) of the MV variable. The peak (or minimum) in the MV for the last iteration of CVs in which the pattern is discernable provides the corresponding $CV_{opt}$ value. This $CV_{opt}$ value may be tracked as discussed with regard to the zero-crossing MV control.

Although the invention has been described with respect to particular embodiments, this description is only an example of the invention's application and should not be taken as a limitation. For example, a conventional feed-forward amplifier could be used in lieu of the modified feed-forward amplifiers discussed previously. Although a conventional feed-forward amplifier would not provide as low a noise floor, low-noise performance would still be enhanced through the intelligent biasing of the variable amplifier feeding the conventional feed-forward amplifier. Consequently, the scope of the invention is set forth in the following claims.

We claim:

1. A system, comprising:
a signal source:
a first variable amplifier adapted to amplify an output signal from the signal source to provide an amplified signal;
a feed-forward amplifier adapted to amplify the amplified signal to provide an amplified output signal;
a phase noise measurement system adapted to provide a first feedback signal that is proportional to phase noise in the amplified output signal; and
a controller adapted to control the amplification provided by the variable amplifier, the controller being responsive to the first feedback signal so as to minimize the phase noise in the amplified output signal,
wherein the feed-forward amplifier includes a VCO controlled to provide a VCO signal having a frequency equaling a frequency of an undesirable signal component in the amplified output signal, the feed-forward amplifier further including a variable phase-shifter and a second variable amplifier to provide a phase-shifted and amplified version of the VCO signal, the feed-forward amplifier further including a coupler to couple the phase-shifted and amplified version of the VCO signal into the amplified output signal, the controller being adapted to control the variable phase-shifter and the second variable amplifier such that the phase-shifted and amplified version of the VCO signal reduces the undesirable signal component.

2. The system of claim 1, wherein the feed-forward amplifier further includes a spectrum analyzer to detect the undesirable signal component.

3. The system of claim 2, wherein the spectrum analyzer is integrated into the controller.

4. The system of claim 3, wherein the controller comprises at least one processor.

5. A system, comprising:
a signal source;
a first variable amplifier adapted to amplify an output signal from the signal source to provide an amplified signal;
a feed-forward amplifier adapted to amplify the amplified signal to provide an amplified output signal;
a phase noise measurement system adapted to provide a first feedback signal that is proportional to phase noise in the amplified output signal; and
a controller adapted to control the amplification provided by the variable amplifier, the controller being responsive to the first feedback signal so as to minimize the phase noise in the amplified output signal,
wherein the phase noise measurement system comprises:
a delay line adapted to receive a version of the amplified output signal to provide a delayed signal;
a second variable amplifier adapted to receive the delayed signal and provide an amplified delayed signal;
a variable phase-shifter adapted to receive a version of the amplified output signal to provide a phase-shifted signal; and
a mixer adapted to mix the amplified delayed signal and the phase-shifted signal to provide a mixer output signal, wherein the first feedback signal is derived from the mixer output signal.

6. The system of claim 5, wherein the phase noise measurement system further comprises:
a variable low-noise matching amplifier adapted to receive the mixer output and provide an analog first feedback signal; and
an analog-to-digital converter adapted to receive the analog first feedback signal to provide the first feedback signal.

7. A method of minimizing a phase noise in an output signal from a feed-forward amplifier, the feed-forward amplifier receiving an input signal from a variable amplifier driven by a signal source, comprising:
measuring the phase noise in the output signal; and
adjusting the variable amplifier to minimize the measure phase noise,
wherein measuring the phase noise comprises
delaying the output signal to provide a delayed signal,
phase-shifting the output signal by approximately 90 degrees to provide a phase-shifted signal,
mixing the delayed signal and the phase-shifted signal to provide a phase-noise signal, and
measuring a power of the phase-noise signal to measure the phase noise.

8. A low-noise source comprising:
an oscillator operable to provide a sinusoid;
a first variable amplifier operable to provide an amplified version of the sinusoid responsive to a first control signal;
a first feedforward amplifier operable to variably amplify the amplified version of the sinusoid to provide a first low-noise source output signal;
a phase noise measurement system operable to provide a feedback signal that is proportional to a phase noise power in the first low-noise source output signal;
a controller operable to control the first control signal responsive to the feedback signal to minimize a phase noise power in the low-noise source output signal;
a second variable amplifier operable to variably amplify the first low-noise source output signal responsive to a second control signal to provide a variably-amplified version of the first low-noise source output signal; and
a second feedforward amplifier operable to amplify the variably-amplified version to provide a second low-noise source output signal, wherein the controller is operable to control the second control signal to minimize a phase noise in the second low-noise source output signal.

* * * * *